United States Patent [19]

Wada et al.

[11] Patent Number: 4,889,584

[45] Date of Patent: Dec. 26, 1989

[54] METHOD OF PRODUCING CONDUCTOR CIRCUIT BOARDS

[75] Inventors: Tatsuo Wada, Ebina; Toshiro Miki, Yokohama; Masamitsu Takenaka, Narashino, all of Japan

[73] Assignees: Meiko Electronics Co., Ltd., Kanagawa; Toagosei Chemical Industry Co., Ltd., Tokyo, both of Japan

[21] Appl. No.: 332,565

[22] Filed: Mar. 31, 1989

[51] Int. Cl.$^4$ .......................... B44C 1/22; C23F 1/02; C03C 15/00; C03C 25/06

[52] U.S. Cl. ...................................... 156/630; 29/846; 29/852; 156/631; 156/634; 156/645; 156/656; 156/659.1; 156/661.1; 156/902; 156/151; 156/233; 156/249; 204/15; 204/23; 427/97

[58] Field of Search ............... 156/629, 630, 631, 634, 156/645, 656, 659.1, 661.1, 150, 902, 151, 233, 249; 174/68.5; 29/846, 852; 428/601, 137, 209, 901; 361/397, 398; 204/15, 23, 24; 427/96-98

[56] References Cited

U.S. PATENT DOCUMENTS

| | | | |
|---|---|---|---|
| 2,984,595 | 5/1961 | Schumpelt et al. | 156/233 X |
| 2,984,597 | 5/1961 | Hennes | 156/233 X |
| 4,790,902 | 12/1988 | Wada et al. | 156/630 |

FOREIGN PATENT DOCUMENTS 58-123793 1/1982 Japan .

Primary Examiner—William A. Powell
Attorney, Agent, or Firm—Frishauf, Holtz, Goodman & Woodward

[57] ABSTRACT

A method suited for producing a conductor circuit board having a high-density, fine circuit pattern. Conductor circuits and dummy circuits are formed on the surface of a planar, electrically conductive substrate, and after removing a resist mask, unnecessary dummy circuits are removed. A thin metal film is formed over the surface of the conductive substrate and the surfaces of the conductor circuits and remaining dummy circuits. An insulating substrate is superposed on the surface of the conductive substrate on which the thin metal film is formed, and the two substrates are pressure-bonded together with heat applied thereto. Subsequently, only the conductive substrate is removed, and exposed portions of the thin metal film are removed by etching. In the case of producing a conductor circuit board with a through hole, a through hole is formed after the step of separating the conductive substrate, and then through-hole plating is carried out, followed by the removal of exposed portions of the thin metal film by etching.

10 Claims, 10 Drawing Sheets

F I G. 13
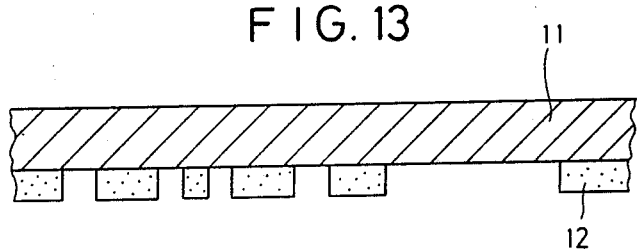
F I G. 14
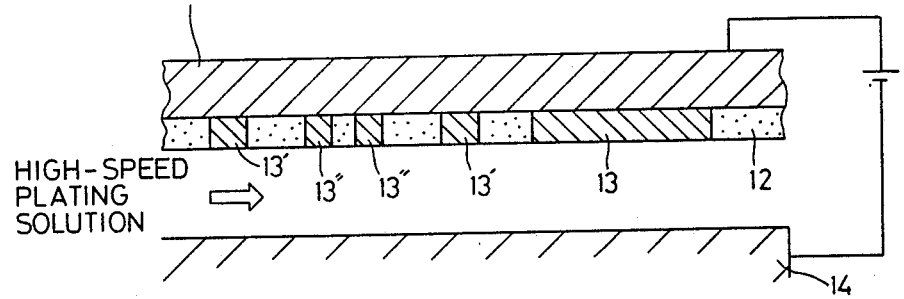
F I G. 15
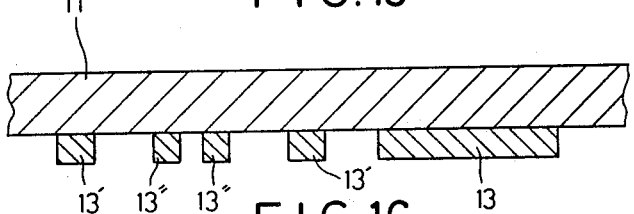
F I G. 16
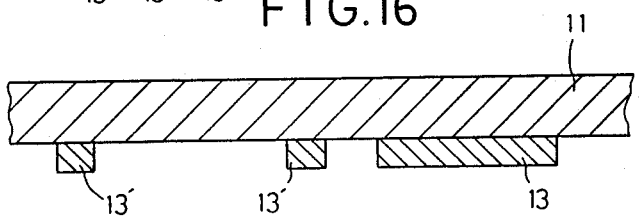
F I G. 17
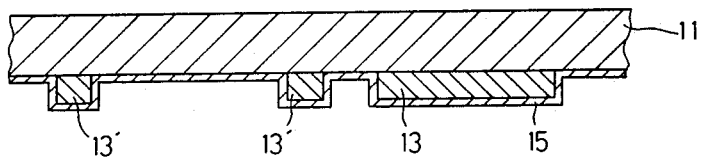

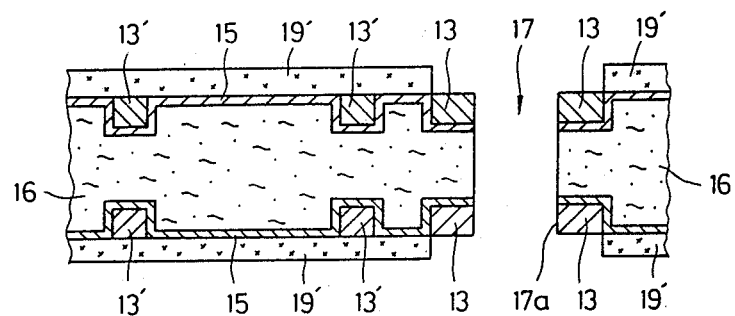
FIG. 27
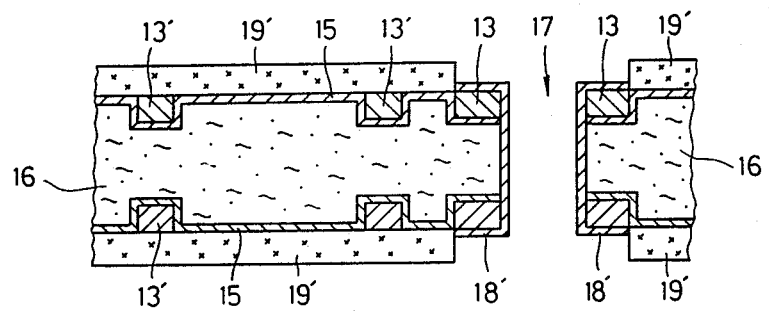
FIG. 28
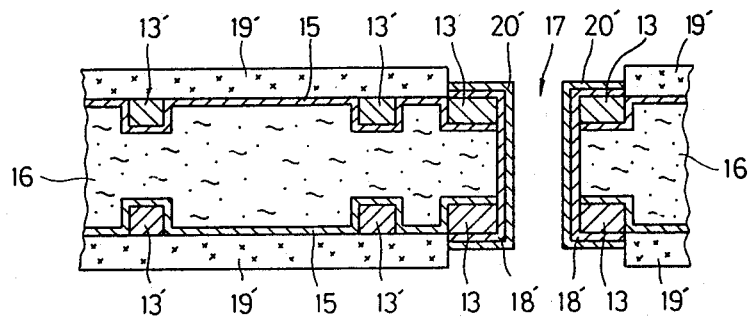
FIG. 29
FIG. 30
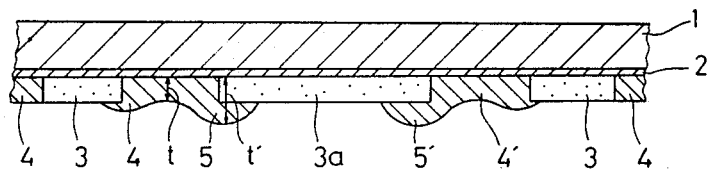

METHOD OF PRODUCING CONDUCTOR CIRCUIT BOARDS

BACKGROUND OF THE INVENTION

The present invention relates to a method of producing conductor circuit boards, and more particularly, to a method of producing conductor circuit boards which is capable of restraining the excessive growth of an edge bead at the boundary between a conductor circuit and a resist mask.

To produce conductor circuit boards, there is a conventional method in which a thin metal film is formed over the entire surface of an electrically conductive substrate which is planar in shape, for example, a resist mask for obtaining a desired circuit pattern is formed on the thin metal film, and a conductor circuit pattern is formed on the surface of the thin metal film except the portions thereof where the resist mask pattern is formed, by an electrolytic plating method using the thin metal film side of the planar conductor substrate as a cathode. Then, an insulating substrate is pressure-bonded to the circuit pattern-side surface of the planar conductive substrate with heat applied thereto, to obtain a laminate, and only the planar conductive substrate is separated from the laminate, thus transferring the conductor circuit pattern to the insulating material.

Thus, the electrolytic plating method is employed to form a conductor circuit pattern on the thin metal film. As such plating method, the so-called high-speed plating method capable of forming a high-quality conductor circuit at high speed is proposed in U.S. Pat. No. 4,790,902. In this method, as illustrated in FIG. 30, first, a thin metal film 2 is formed over the entire surface of a planar, electrically conductive substrate 1, and a resist mask 3, 3a is formed on the surface of the thin metal film 2 except the portions thereof on which a conductor circuit pattern is to be formed. Subsequently, the planar conductive substrate 1 is positioned such that the surface thereof on which the thin metal film 2 is formed is spaced at a predetermined distance from a planar anode (not shown), and a plating solution is supplied at high speed between the anode and the metal film-side surface of the conductive substrate 1 serving as a cathode, thereby depositing copper on the conductor circuit-forming portions of the cathode surface to form conductor circuits 4 and 4' with a desired thickness.

According to this method, however, if some conductor circuits of the conductor circuit pattern to be formed, for example, the conductor circuits 4 and 4', are located far from each other, that is, if the conductor circuits 4 and 4' are individually isolated in position from the other circuits, so-called edge beads (also called "dog-bones") 5 and 5' are concentratively formed at the boundary between the conductor circuit and the resist mask 3a corresponding to the blank portion between the conductor circuits 4 and 4', as shown in FIG. 30. The edge beads 5 and 5' are produced as a result of the phenomenon that an electrolytic current concentratively flows through the edge portions of conductor circuits that are in the process of being formed during the electrolytic plating and accordingly a plating metal is excessively deposited on the edge portions.

If this phenomenon occurs, the thickness and width of the conductor circuits become much greater than their respective design values. As a result, air may be trapped near the edge beads, or in some cases, the edge beads may penetrate into the insulating substrate when the conductor circuits are transferred to the insulating substrate, to cause an accident such as short-circuiting. Further, when the conductor circuit board is to be used as a high-frequency circuit board, the widths of the conductor circuits and the insulation spacings between the circuits must be strictly set in order to ensure satisfactory characteristics. In such cases, if the edge beads are produced during the formation of the conductor circuits, the high-frequency characteristics of the substrate are extremely deteriorated.

The growth of the edge beads 5 and 5' is promoted with increase of the current density during the electrolytic plating. For example, there are occasions when the ratio of the height t' of the edge beads (5, 5') to the thickness t of the middle portion of the conductor circuits (4, 4'), i.e., t'/t, is 1.9 at the least or as large as 5 to 6 (FIG. 30).

To solve this problem, a method of restraining the growth of edge beads has been proposed in which, before carrying out the electrolytic plating step, a dummy circuit is formed between the conductor circuits 4 and 4' which are isolated from each other (see Japanese Provisional Patent Publication No. 58-123793).

According to this method, if the dummy circuit is not to be incorporated into the final conductor circuit board, only the dummy circuit must be removed before the conductor circuit pattern on the planar conductive substrate is transferred to the insulating substrate.

It is, however, very difficult to remove only the dummy circuit, since the thin metal film 2 is formed over the entire surface of the planar conductive substrate 1.

If no thin metal film is formed and the dummy circuit and conductor circuits having respective predetermined patterns are formed directly on the surface of the planar conductive substrate, the dummy circuit could be removed relatively easily. In this case, however, if the dummy circuit is removed, part of the surface of the planar conductive substrate is exposed between the conductor circuits. As a result, an insulating material, or a matrix resin of the insulating substrate, enters small pits present in the surface of the planer conductive substrate during the transfer step and firmly adheres to the conductive substrate, thus posing the problem that the conductor circuit pattern cannot be transferred.

Further, with the above-described method in which no thin metal film is formed on the entire surface of the planar conductive substrate 1, it is not possible to produce a conductor circuit board whose conductor circuits to be formed are electrically isolated from one another and in which a through hole must be formed in the isolated conductor circuits and through-hole plating is carried out. The reason is that the isolated circuits are not electrically connected and accordingly the inner surface of the through hole cannot be plated.

OBJECTS AND SUMMARY OF THE INVENTION

An object of the present invention is to provide a method of producing conductor circuit boards which is capable of restraining edge beads from growing during the formation of conductor circuits and thus enable the thicknesses and widths of the conductor circuits and insulation spacings to be set substantially in accordance with their respective design values.

Another object of the present invention is to provide a method of producing conductor circuit boards which can prevent air traps from being produced near edge beads and prevent the edge beads from penetrating into an insulating substrate when a conductor circuit pattern is transferred to the insulating substrate, and thus can eliminate an accident such as short-circuiting.

A further object of the present invention is to provide a method of producing conductor circuit boards which permits only a dummy circuit to be removed easily and which is excellent in the transferability of a conductor circuit pattern.

Still another object of the present invention is to provide a method of producing conductor circuit boards which permits through-hole plating to be performed on conductor circuits on which isolated conductor circuits with a through hole need be formed.

A still further object of the present invention is to provide a method of producing conductor circuit boards which are excellent in high-frequency characteristics.

According to one aspect of the present invention, there is provided a method of producing a conductor circuit board, which comprises the steps of: forming a resist mask on a surface of a planar, electrically conductive substrate except portions thereof on which conductor circuits and dummy circuit are to be formed, the dummy circuit being formed between and close to conductor circuits which are isolated from each other; forming the conductor circuits and the dummy circuit on the surface of the electrically conductive substrate by electroplating; removing the resist mask from the electrically conductive substrate; forming a thin metal film over the surface of the electrically conductive substrate and surfaces of the conductor circuits; superposing an insulating substrate on the surface of the electrically conductive substrate on which the conductor circuits and the thin metal film are formed, and pressure-bonding the insulating substrate and the electrically conductive substrate together to obtain a laminate; separating only the electrically conductive substrate from the laminate, to obtain a circuit board; and removing portions of the thin metal film which electrically connect between the conductor circuits, by etching.

According to another aspect of the invention, a method of producing a conductor circuit board is provided which comprises the steps of: forming a resist mask on a surface of a planar, electrically conductive substrate except portions thereof on which conductor circuits and dummy circuit are to be formed, the dummy circuit being formed between the close to conductor circuits which are isolated from each other; forming the conductor circuits and the dummy circuit on the surface of the electrically conductive substrate by electroplating; removing the resist mask from the electrically conductive substrate; forming a thin metal film over the surface of the electrically conductive substrate and surfaces of the conductor circuits; sandwiching an insulating substrate between two electrically conductive substrates formed by the above-mentioned steps and having first and second circuit patterns, respectively, the surface of each of the two electrically conductive substrates on which the conductor circuits and the thin metal film are formed facing the insulating substrate, and pressure-bonding the insulating substrate and the two electrically conductive substrates together to obtain a laminate; separating only the two electrically conductive substrates from the laminate, to obtain a circuit board; forming a through hole in the circuit board; and subjecting an inner surface of the through hole and both surfaces of the circuit board to through-hole plating; and removing portions of the thin metal film which electrically connect between the conductor circuits, by etching.

The above and other objects, features, and advantages of the present invention will become more apparent from the ensuing detailed description taken in connection with the accompanying drawings.

BRIEF DESCRIPTION OF THE DRAWINGS

FIG. 13 is a sectional view of an electrically conductive substrate and a resist mask formed on the surface of the substrate in step (b) of FIG. 12;

FIG. 14 is a sectional view of the conductive substrate, with conductor circuits and dummy circuits formed on the substrate surface in step (c) of FIG. 12;

FIG. 15 is a sectional view of the conductive substrate from which the resist mask has been removed in step (d) of FIG. 12;

FIG. 16 is a sectional view of the conductive substrate from which the dummy circuits have been removed in step (e) of FIG. 12;

FIG. 17 is a sectional view of the conductive substrate, with a thin metal film formed over the surfaces of the substrate and conductor circuits in step (f) of FIG. 12;

FIG. 27 is a sectional view of a circuit board which has been subjected to resist-mask formation step (k) directly after the formation of a through hole in step (j) of FIG. 12;

FIG. 28 is a sectional view of a circuit board obtained by subjecting the circuit board of FIG. 27 to chemical copper plating;

FIG. 29 is a sectional view of a circuit board obtained by subjecting the circuit board of FIG. 28 to through-hole plating in step (l) of FIG. 12; and FIG. 30 is a sectional view of an electrically conductive substrate, showing edge beads grown during the step (c) of FIG. 1 or 12.

DETAILED DESCRIPTION

A first embodiment of the present invention will be first described in detail with reference to FIGS. 1 to 9.

A planar, electrically conductive substrate 11 to be used is preferably made of a material which is resistant to electrolytic corrosion and chemicals used in a plating step. Examples of such a material includes a stainless-steel plate (e.g., hardened SUS-630 as one of the best examples), nickel plate, titanium or titanium alloy plate, copper or copper-alloy plate, etc. Preferably, dirt and oxide film on the surface of the conductive substrate 11 are removed, and the surface is pre-treated to obtain a necessary roughness (Step (a) of FIG. 1). The surface roughness of the conductive substrate 11 influences the adhesion strength of a thin metal film 15, which is formed on the conductive substrate 11 in a later step, the production of pinholes, and also the surface roughness of the thin metal film 15. Preferably, the surface roughness of the conductive substrate 11 is set such that an adhesion permitting easy separation of the planar conductive substrate 11 in a separation step (Step (h) of FIG. 1) described later is obtained.

The surface of the planar conductive substrate 11 may be roughened chemically, or may be roughened mechanically by wet sand blasting (liquid honing) or the like after it is cleaned chemically.

Figure 1:
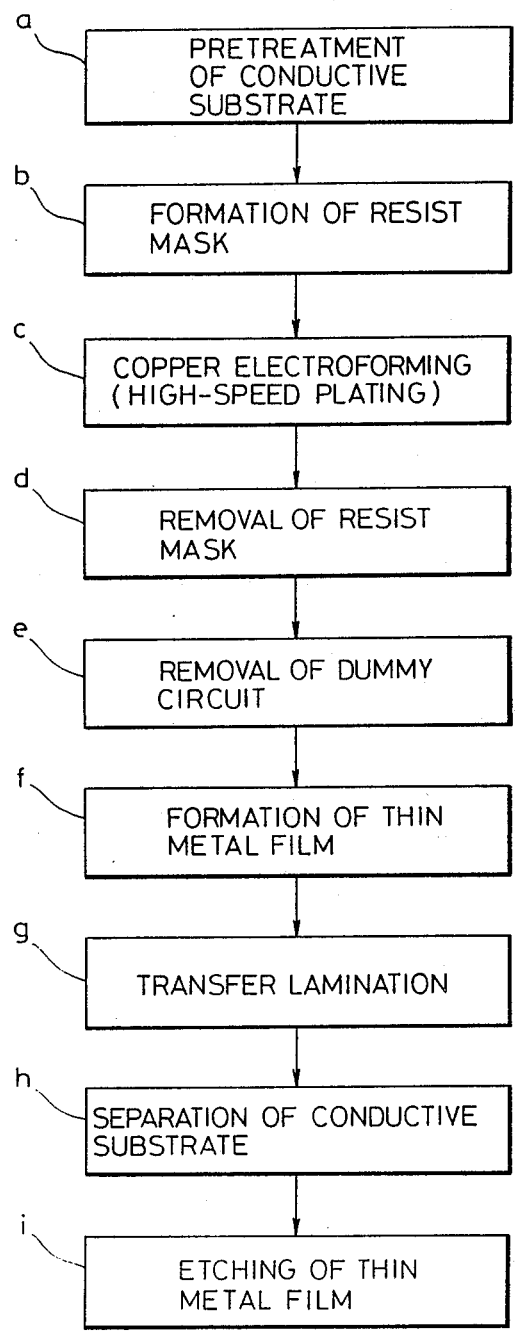
FIG. 1 (a-i) is a process flowchart illustrating a method according to a first embodiment of the present invention.
Figure 2:
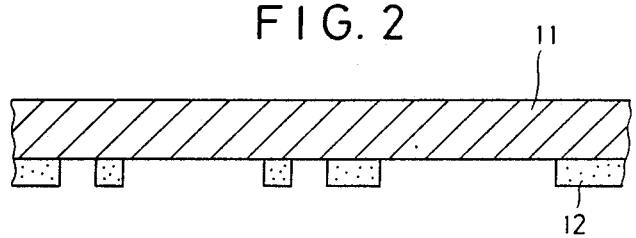
FIG. 2 is a sectional view of an electrically conductive substrate and a resist mask formed on the surface of the substrate in step (b) of FIG. 1.

A resist mask 12 is formed (Step (b) of FIG. 1; FIG. 2), by the photoresist method or printing method, on the surface of the planar conductive substrate 11 except those portions thereof on which conductor circuits 13 and 13' and a dummy circuit 13" are to be formed. In this step, a resist material having excellent adhesion with the conductive substrate 11 is used. First, a resist layer is formed by laminating photosensitive resist films one upon another, or by applying liquid photoresist and then drying the same, and a desired pattern of the resist mask 12 is obtained by exposure and development. In the case where the spacing of conductor circuits to be formed is not narrow, the pattern of the resist mask 12 may be formed by the screen printing method, for example.

Figure 3:
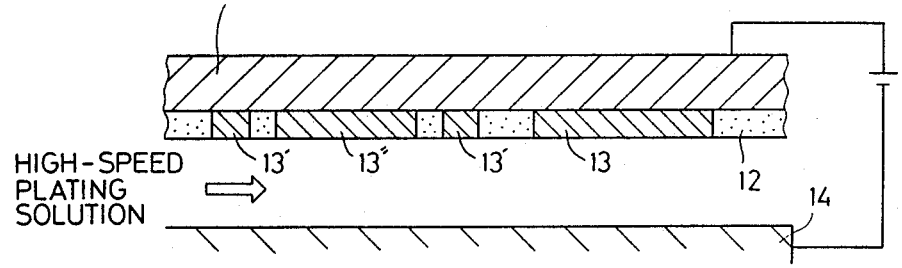
FIG. 3 is a sectional view of the conductive substrate, with conductor circuits and a dummy circuit formed on the substrate surface in step (c) of FIG. 1.

Subsequently, the conductive substrate 11 for use as a cathode, with the resist mask 12 formed thereon in the above manner, is opposed to an anode 14 at a predetermined distance (e.g., 3 to 30 mm, preferably, 11 to 15 mm) therefrom, and copper is electrodeposited on the substrate 11 to form the conductor circuits 13 and 13' and the dummy circuit 13" (Step (c) of FIG. 1; FIG. 3), by high-speed plating. The plating solution used for the high-speed plating may be a copper sulfate plating solution whose metallic copper content ranges from 0.20 to 2.0 mol/l, preferably, from 0.25 to 0.98 mol/l, and whose sulfuric acid content ranges from 50 to 220 g/l. To ensure the uniformity of plating, CUPPORAPID Hs (trade name) produced by LPW Co., Ltd., West Germany, is added to the copper sulfate solution at the rate of 1.5 ml/l. Alternatively, an ordinary plating solution, such as a copper pyrophosphate solution, may be used. In this electroforming step, the current density, solution contact speed with respect to the electrodes, and plating solution temperature are set to 0.15 to 4 $A/cm^2$, 6 to 12 m/sec, and 45° to 70° C., preferably 60° to 65° C., respectively. If the plating solution temperature is lower than 45° C., the moving speed of copper ions lowers so that polarized layers are liable to be formed on the surfaces of the electrodes. Thus, the plating deposition speed is lowered. If the solution temperature exceeds 70° C., the evaporation loss of the plating solution increases so that the concentration of the solution becomes unstable. Also, the increase of the solution temperature puts restrictions on equipment, that is, a larger space, special equipments, etc. are required.

Figure 7:
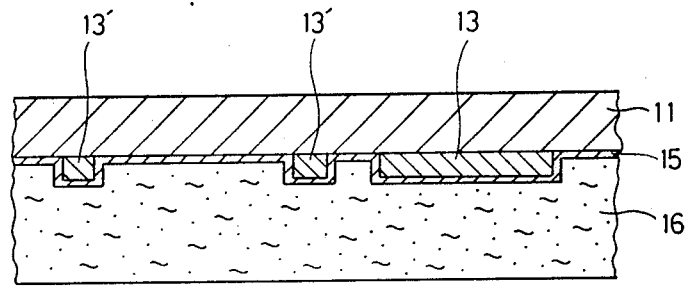
FIG. 7 is a sectional view of a laminate obtained in step (g) of FIG. 1.

At this stage, even if the distance between the conductor circuits 13' and 13' are so large (e.g., 2 mm or more) that edge beads large enough to exceed an allowable ratio (t'/t) can be formed, the growth of edge beads during the electroforming can be restrained since the dummy circuit 13" is formed between and close to the circuits 13' and 13', as shown in FIG. 3. Therefore, inconveniences such as short-circuiting between the conductor circuits 13' and 13' during a transfer step (Step (g) of FIG. 1; FIG. 7), described later, can advantageously be eliminated. More specifically, the growth of edge beads during the electroforming step can be restrained so that the ratio between a height t' of the edge beads from the surface of the planar conductive substrate and a thickness t of the middle portion of the conductor circuits, i.e., t'/t, falls within the range of 1.0 to 1.8. The position and number of dummy circuits, the distance between the dummy circuit and the conductor circuits, etc. may be suitably determined in accordance with the distance between the conductor circuits 13' and 13', and other factors.

By adjusting the current density and the solution contact speed with respect to the electrodes to the aforementioned predetermined conditions, the conductor circuits 13 and 13' and dummy circuit 13" are deposited on the planar conductive substrate 11 at a deposition speed of 25 to 100 μm. Moreover, deposited copper grains can be made very fine, so that the conductor circuits 13 and 13' can enjoy an elongation percentage of 16 to 25% without losing their tensile strength. This elongation percentage is 1.5 to 2 times the elongation percentage of conductor circuits formed by the conventional plating method (or equal to or higher than that of a rolled annealed copper foil), and thus conductor circuits of very soft copper can be made. Thus, the copper film obtained has a property equivalent to that of a rolled annealed copper foil, and therefore the copper-electroforming step (c) using high-speed plating is particularly effective in producing flexible substrates which require high bending capability.

Figure 4:
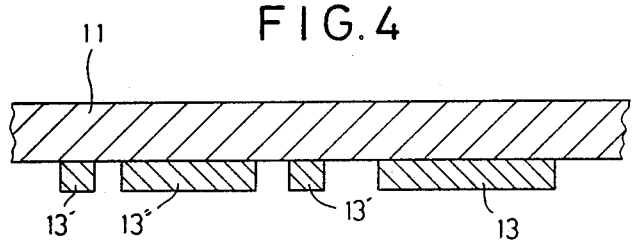
FIG. 4 is a sectional view of the conductive circuit from which the resist mask has been removed in step (d) of FIG. 1.

When the thickness of the conductor circuits 13 and 13' and dummy circuit 13" reaches a predetermined thickness (e.g., 2 to 300 μm) during the copper-electroforming step, the electric supply and the supply of the plating solution are stopped. After rinsing the substrate, a step of removing the resist mask 12 is carried out (Step (d) of FIG. 1; FIG. 4). A solution of caustic soda, for example, is used in the removal of the resist mask 12. The substrate is immersed in the solution for 30 to 60 seconds to remove the resist mask 12 by dissolution, and is rinsed and dried.

Figure 5:
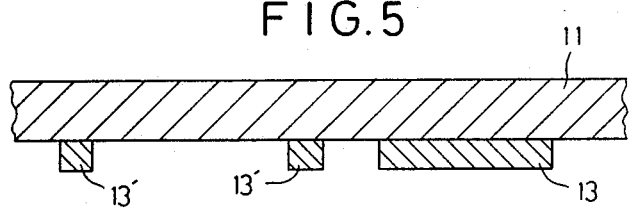
FIG. 5 is a sectional view of the conductive substrate from which the dummy circuit has been removed in step (e) in FIG. 1.

If the dummy circuit 13" is not to be incorporated into the final conductor circuit board, it is removed from the substrate (Step (e) of FIG. 1; FIG. 5). This may be carried out by removing only the dummy circuit 13" physically or mechanically. Alternatively, the dummy circuit 13" may be removed by chemical etching, with the conductor circuits 13 and 13' protected by a resist mask or the like. In this case, the step of removing the dummy circuit 13" may be carried out before the aforementioned step of removing the resist mask 12.

It is not necessary to remove all of the dummy circuit 13"; part of the dummy circuit may be left except those portions thereof which will cause inconveniences if not removed.

Figure 6:
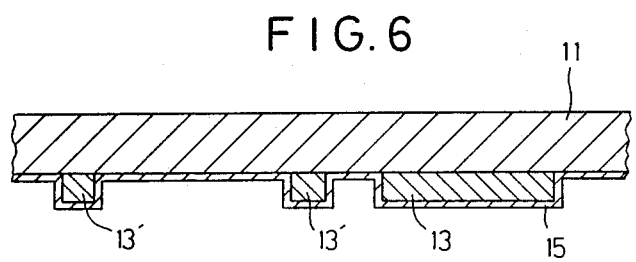
FIG. 6 is a sectional view of the conductive substrate, with a thin metal film formed over the surfaces of the substrate and conductor circuits in step (f) in FIG. 1.

Subsequently, the planar conductive substrate 11 with the conductor circuits 13 and 13' formed thereon is subjected to the next step in which a thin metal film 15 is formed over the entire surface of the conductive substrate 11 (Step (f) of FIG. 1; FIG. 6). Copper, nickel, zinc, etc., may suitably be used for the thin metal film 15. The thin metal film 15 is deposited to a thickness of 0.5 to 5 μm, by a dry method such as vacuum deposition, sputtering, CVD or the like, or by a wet method such as electroplating, electroless plating, or the like. The high-speed plating is one of the best methods in view of working efficiency.

Now, a step of forming a thin copper film by high-speed plating will be explained as an example of the thin metal film-formation step. First, the planar conductive substrate 11, for use as a cathode, is opposed to the anode 14 at a predetermined distance of 3 to 30 mm therefrom, as shown in FIG. 3, and the thin copper film 15 is precipitated electrolytically on the conductive substrate 11 and conductor circuits 13 and 13' by high-speed plating.

The high-speed plating is carried out under the conditions that the cathode, i.e., the conductive substrate, is rotated or the plating solution is supplied forcibly between the fixed electrodes, so that a plating solution of 45° to 70° C. causes a turbulent flow on the surface of the cathode, that is, an interelectrode distance of 3 to 30 mm and a plating-solution contact speed of 6 to 12 m/sec with respect to the electrodes are obtained. Preferably, in this case, a copper sulfate plating solution or copper pyrophosphate solution, for example, is used as the plating solution, a current of cathode-current density of 0.15 to 4.0 A/cm$^2$ is applied, and the deposition speed of the copper film is set to 25 to 100 μm/min.

Since the thin copper film 15 is electrodeposited by high-speed plating on the planar conductive substrate 11 having the necessary surface roughness as mentioned above, the former is bonded to the latter with a suitable adhesion strength, thus permitting the subsequent step of transfer lamination to be carried out smoothly.

Figure 8:
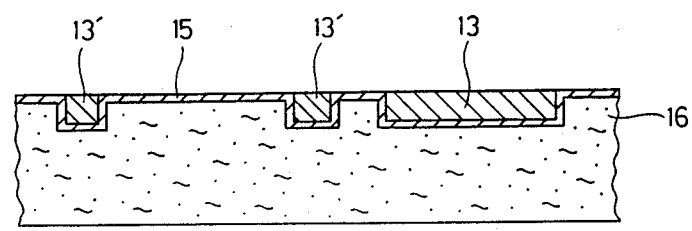
FIG. 8 is a sectional view of a circuit board obtained by separating only the electrically conductive substrate from the laminate in step (h) of FIG. 1.

Next, an insulating substrate 16 is superposed on that surface of the conductive substrate 11 on which the thin metal film 15 is formed, and these two substrates are pressure-bonded together with or without heat applied thereto, to obtain a laminate (Step (g) of FIG. 1; FIG. 7). Both organic and inorganic materials, such as glass, epoxy resin, phenolic resin, polyimide resin, polyester resin, aramid resin, etc., may be used for the insulating substrate 16. Also available are materials which are obtained by enameling the surface of an electrically conductive material, such as iron or aluminum, or by subjecting the surface of an aluminum plate to alumilite treatment for insulation. In general, in this step (g), glass cloth or the like is impregnated with epoxy resin, thereby forming a prepreg in a semi-cured state (B-stage). The prepreg and the conductive substrate are superposed such that the conductor circuits 13 and 13' and part of the thin metal film 15 sink into the prepreg (as indicated in FIG. 8), and are bonded together under heat and pressure.

In this transfer step, the conductor circuits 13 and 13' and the thin metal film 15, along with the thick conductive substrate 11, are stacked on and bonded with heat and pressure to the insulating substrate 16 for integral lamination. Thus, the conductor circuits 13 and 13' are held on the conductive substrate 11 when transferred to the insulating substrate 16, so that their dimensional stability is secured. Further, since the conductive substrate 11 serves also as a transfer jig, the transfer process requires no special jig. Moreover, the thin metal film 15 and the conductor circuits 13 and 13' are coupled to each other with a strong force of adhesion. Therefore, during the transfer operation, the conductor circuits 13 and 13' cannot be dislocated (or undergo a swing as it is called) and accordingly are satisfactory in dimensional stability. Thus, the conductor circuits are adapted for even high-density circuits which have a fine conductor circuit pattern (for example, a pattern width of several microns to several tens of microns can be effected).

Then, after the insulating substrate 16 is heated and solidified, only the planar conductive substrate 11 is separated from the conductor circuits 13 and 13' and thin metal film 15, which are transferred to the insulating substrate 16, thereby obtaining a circuit board in which the conductor circuits 3 and 13' and thin metal film 15 are integrally bonded to the surface of the insulating substrate 16 (Step (h) of FIG. 1; FIG. 8). At this time, the force of adhesion between the thin metal film 15 and the conductor circuits 13 and 13' is greater than that between the conductive substrate 11 and the thin metal film 15. Also, the force of adhesion between the thin metal film 15 and the insulating substrate 16 is greater than that between the thin metal film 15 and the conductive substrate 11. Accordingly, the conductive substrate 11 is separated at the interface thereof with the conductor circuits 13, 13' and thin metal film 15, so that the thin metal film 15 and the conductor circuits 13 and 13' are transferred to and adhered integrally on the side of the insulating substrate 16.

Figure 9:
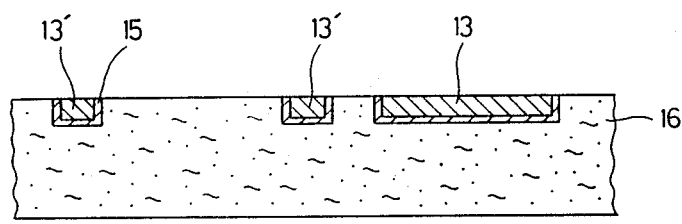
FIG. 9 is a sectional view of a conductor circuit board obtained by removing the thin metal film in step (i) of FIG. 1.

Subsequently, etching is performed on the surfaces of the thin metal film 15 and conductor circuits 13 and 13', to remove those portions of the thin metal film which electrically connect the conductor circuits with one another (Step (i) of FIG. 1; FIG. 9), thereby obtaining a finished conductor circuit board. In the circuit board obtained, the insulating substrate 16 is exposed between the conductor circuits 13 and 13'. Therefore, in the etching step, a suitable etchant is used so that only the thin metal film 15 can be selectively etched.

The foregoing description is given with reference to a conductor circuit board having the two conductor circuits 13 and 13' spaced at the predetermined distance or more from each other, as isolated conductor circuits. The isolated conductor circuits may alternatively be a terminal spaced from a circuit portion on the substrate, an outer frame similarly spaced from the circuit portion, or any other conductor portion, at least one side of which is spaced at the predetermined distance or more from another conductor portion. The manufacturing steps described above can also be effectively applied to circuit boards having such conductor portions.

Figure 10:
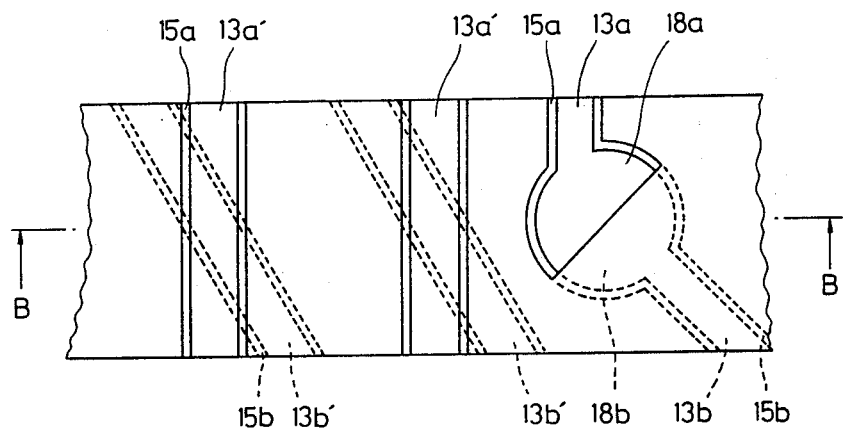
FIG. 10 is a plan view of a one-sided two-layer conductor circuit board produced according to a method of the invention.
Figure 11:
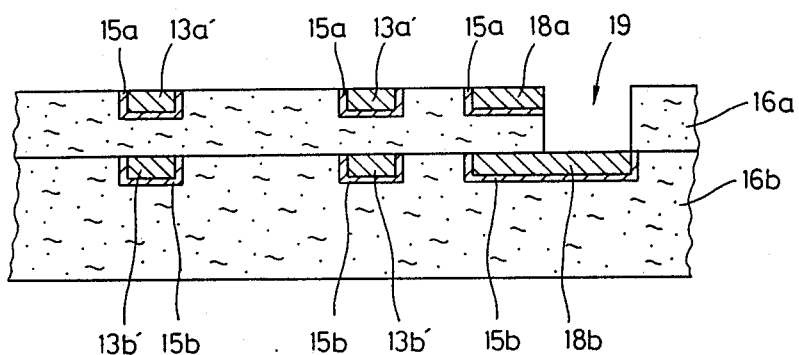
FIG. 11 is a sectional view taken along line B—B in FIG. 10.

Further, according to the method of the invention, a one-sided multilayer conductor circuit board can be produced by stacking two or more one-sided conductor circuit boards manufactured in the above-described manner. FIG. 10 is a plan view showing an example of a one-sided two-layer conductor circuit board, and FIG. 11 is a sectional view of the circuit board taken along line B—B in FIG. 10. Insulating substrates 16a and 16b respectively formed with conductor circuits 13a, 13a' and 13b, 13b' by the processes shown in FIGS. 2 through 9 are stacked one on the other with an adhesive applied therebetween. In order to achieve electrical connection between upper and lower conductor circuits, for example, between the conductor circuits 13a and 13b, lands 18a and 18b electrically connected to the conductor circuits 13a and 13b, respectively, are formed together with the conductor circuits in the copper-electroforming step (FIG. 3), one of the lands, i.e., 18a, is punched to make a hole 19, and the two lands are connected to each other by soldering, for example.

A method of producing conductor circuit boards according to another embodiment of the present invention will now be described with reference to FIGS. 12 to 29. This method is applied to the manufacture of a double-sided or multilayer conductor circuit board having through holes.

Figure 12:
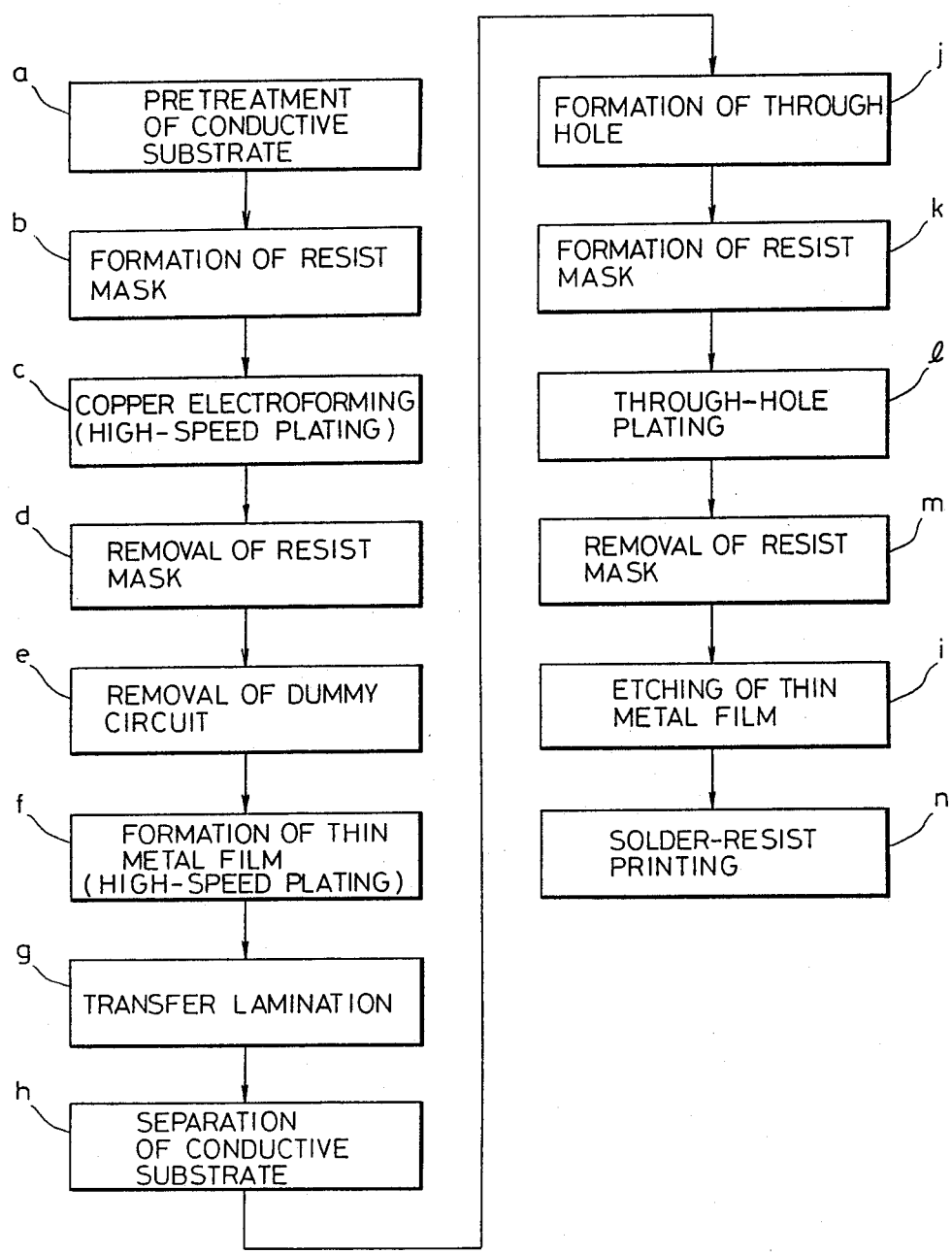
FIG. 12 is a process flowchart illustrating a method according to another embodiment of the present invention.
Figure 18:
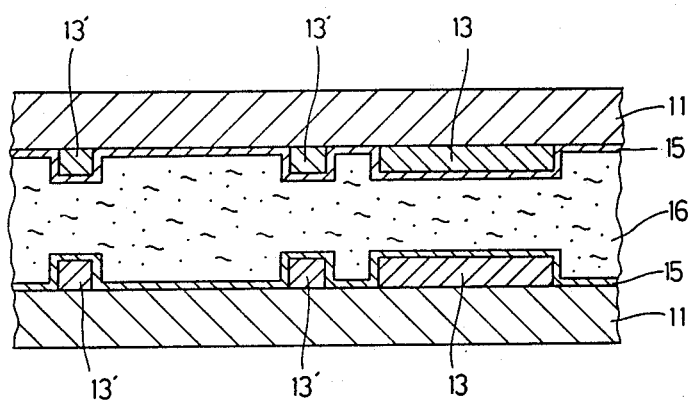
FIG. 18 is a sectional view of a laminate obtained in step (g) of FIG. 12.

In this embodiment, steps (a) through (f) of FIG. 12 (FIGS. 13 through 17) are similar to the steps (a) through (f) of FIG. 1 (FIGS. 2 through 6), respectively.

In the step (g) of FIG. 12 (FIG. 18), an insulating substrate 16 is sandwiched between two electrically conductive substrates 11, such that the surface of respective conductive substrate 11 on which a thin metal film 15 is formed faced the insulating substrate 16, and the resulting structure is subjected to hot pressing to obtain a laminated. The material of the insulating substrate is selected from those mentioned with reference to the step (g) of FIG. 1, and the hot pressing conditions and the resulting effects are similar to those in the case of the step (g) of FIG. 1.

Figure 19:
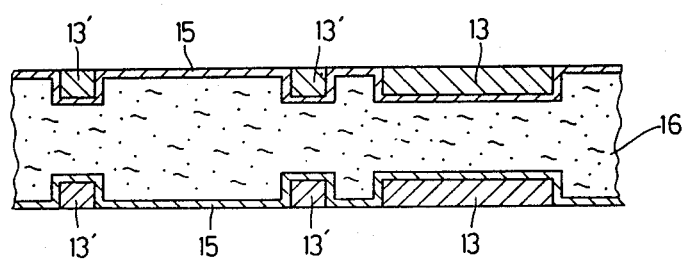
FIG. 19 is a sectional view of a circuit board obtained by separating only the conductive substrates from the laminate of FIG. 18 in step (h) of FIG. 12.

After the insulating substrate 16 is heated and solidified, only the conductive substrates 11 attached to both surfaces of the insulating substrate are separated from the respective conductor circuits 13, 13' and thin metal film 15, which are transferred to the insulating substrate 16, thereby obtaining a circuit board comprising the conductor circuits 13 and 13' and thin metal film 15 integrally bonded to both surfaces of the insulating substrate 16 (Step (h) of FIG. 12; FIG. 19).

Figure 20:
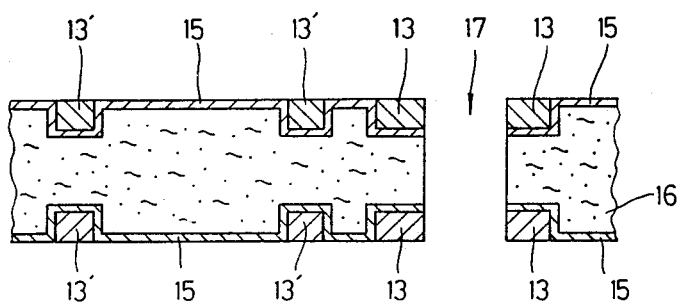
FIG. 20 is a sectional view of the circuit board in which a through hole has been formed in step (j) of FIG. 12.

Subsequently, a through hole 17 is formed (Step (j) of FIG. 12; FIG. 20) for connecting between the conductor circuits 13 and 13 embedded in their respective surface regions of the insulating substrate 16. The through hole 17 may be formed by an ordinary method, for example, by using a drill. Then, a thin copper layer 18 is formed over the entire surface of the circuit board, inclusive of the inner surface of the through hole 17, for the preparation of through-hole plating described hereinafter (FIG. 21).

Figure 22:
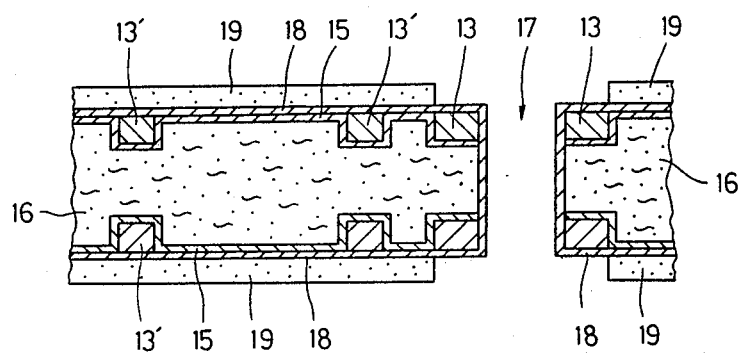
FIG. 22 (a-n) is a sectional view illustrating the formation of a resist mask on the surface of the circuit board of FIG. 21 in step (k) of FIG. 12.

A resist mask 19 is then formed on the thin copper layer 18, except the inner surface of the through hole 17, the peripheral portions of the open ends of the hole 17, and, if necessary, portions where connectors and the like are to be formed and accordingly it is undesirable to form flush circuits (Step (k) of FIG. 12; FIG. 22).

Figure 23:
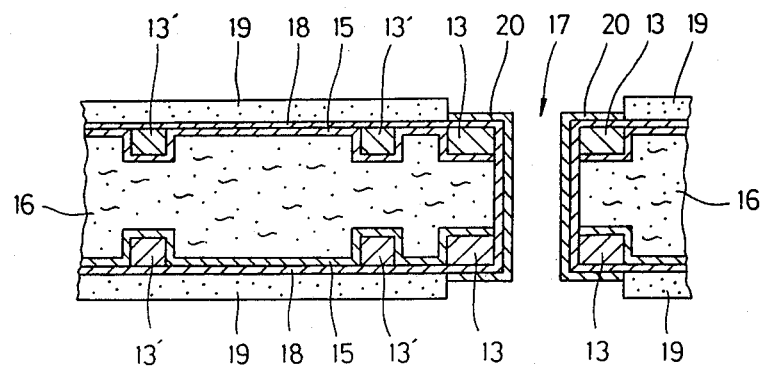
FIG. 23 is a sectional view of the circuit board in which the through hole and its peripheral portions have been subjected to through-hole plating in step (l) of FIG. 12.
Figure 24:
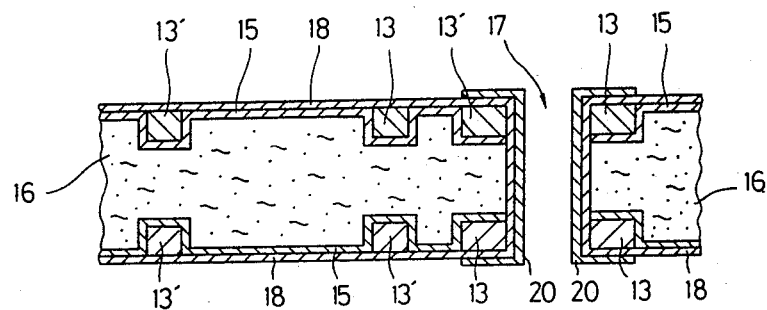
FIG. 24 is a sectional view of the circuit board from which the resist mask has been removed in step (m) of FIG. 12.

Then, the surface of the circuit board except the portions thereof where no resist mask 19 is formed is subjected to through-hole plating, for example, by copper electroplating using a copper pyrophosphate solution, a copper sulfate plating solution (copper sulfate plating solution for bright plating) or the like, to form a through-hole plating layer 20 (Step (l) of FIG. 12; FIG. 23). Next, the resist mask 19 on the circuit board is removed (Step (m) of FIG. 12; FIG. 24). Meanwhile, the through-hole plating step referred to in this embodiment includes both the chemical copper plating (FIG. 21) described above, and the step of forming the through-hole plating layer (FIG. 23) by electroplating. In carrying out the through-hole plating step, even if the conductor circuits 13 having the through hole 17 formed therein are electrically isolated circuits, electrical connection to these circuits is achieved by the thin metal film 15 formed over the entire surface of the insulating substrate 16, and accordingly the through-hole plating can be effected without a hitch.

Figure 21:
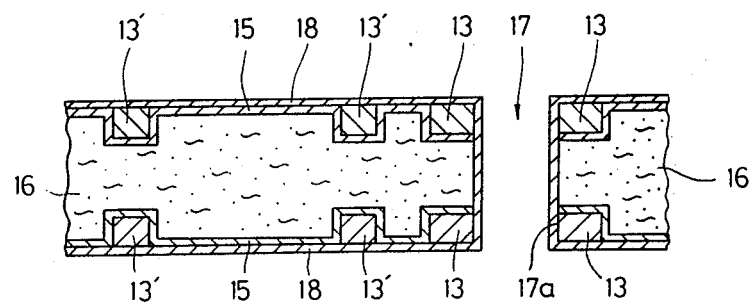
FIG. 21 is a sectional view of the circuit board whose surface, including the inner surface of the through hole, has been subjected to chemical copper plating in step (j) of FIG. 12.
Figure 25:
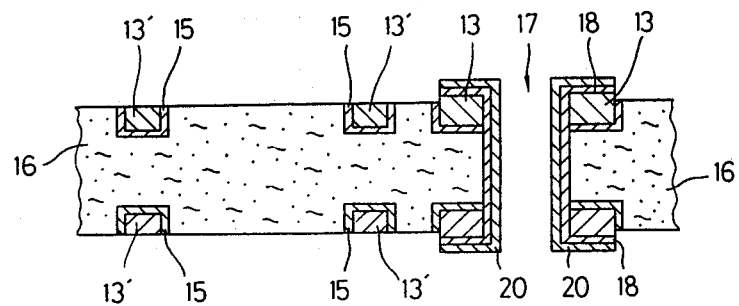
FIG. 25 is a sectional view of the circuit board from which the thin metal film has been etched in step (i) of FIG. 12.

The through-hole plating step is not limited to the process illustrated in FIGS. 21 to 23; the process shown in FIGS. 27 to 29 may alternatively be carried out. More specifically, a resist mask 19' is formed on the circuit board, except the lands of the insulating substrate 16 in which the through hole 17 is formed, and, if required, portions where connectors and the like are to be formed and accordingly it is undesirable to form flush circuits (FIG. 27). Subsequently, a thin copper layer 18' is formed by chemical copper plating (FIG. 28), and a through-hole plating layer 20' is formed by electroplating (FIG. 29). Then, the resist mask 19' is removed, as in the step (m) of FIG. 12 (FIG. 24), and the thin copper film 15 is etched (FIG. 25). According to this through-hole plating process, electroless plating and through-hole plating can be carried out successively, and accordingly the working efficiency is improved. Since, however, the electroless plating, i.e., chemical copper plating, is carried out after the resist mask 19' is formed, the resist material used may preferably be a material which contains a catalyst poison etc., for example, and has alkali resistance so that the resist mask 19' may not be corroded by an alkaline electroless-plating solution. In the case where an alkali-resistant material cannot be used as the resist material due to various restrictions, the electroless plating may be carried out by an acid plating such as acid nickel plating or the like.

Subsequently, the thin metal films 15 and the surfaces of the conductor circuits 13 and 13' are sequentially etched (Step (i) of FIG. 12; FIGS. 24 and 25), thereby obtaining a final conductor circuit board. At this time, if necessary, the through-hole plating layer 20 may be protected by a tenting method using a dry film, etc. In the etching step (i), which may be effected, for example, by wet etching, the portions of the thin metal film electrically connecting between the conductor circuits 13 and 13' on the surface of the circuit board are removed, so that the insulating substrate 16 is exposed between the conductor circuits.

Figure 26:
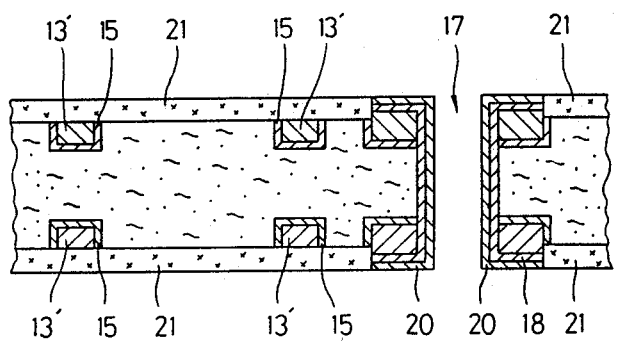
FIG. 26 is a sectional view of a conductor circuit board which has been subjected to solder-resist printing in step (n) of FIG. 12.

After the etching step (i) is completed, solder-resist printing may be carried out on both surfaces of the conductor circuit board, if desired, to form a solder-resist layer 21 (Step (n) of FIG. 12; FIG. 26).

In the second embodiment described above, the conductor circuit board has at each side thereof the conductor circuits 13' and 13' spaced at the predetermined distance or more from each other, as isolated conductor circuits. The isolated conductor circuits may alternatively be a terminal spaced from a circuit portion on the substrate, an outer frame similarly spaced from the circuit portion, or any other conductor portion, at least one side of which is spaced at the predetermined distance or more from another conductor portion. The manufacturing steps described above can also be effectively applied to circuit boards having such conductor portions.

What is claimed is:

1. A method of producing a conductor circuit board, comprising the steps of:
    forming a resist mask on a surface of a planar, electrically conductive substrate except portions thereof on which conductor circuits and dummy circuit are to be formed, said dummy circuit being formed between and close to conductor circuits which are isolated from each other;
    forming said conductor circuits and said dummy circuit on the surface of said electrically conductive substrate by electroplating;
    removing said resist mask from said electrically conductive substrate;
    forming a thin metal film over the surface of said electrically conductive substrate and surfaces of said conductor circuits;
    superposing an insulating substrate on the surface of said electrically conductive substrate on which said conductor circuits and said thin metal film are formed, and pressure-bonding said insulating substrate and said electrically conductive substrate together to obtain a laminate;
    separating only said electrically conductive substrate from said laminate, to obtain a circuit board; and
    removing portions of said thin metal film which electrically connect between said conductor circuits, by etching.

2. The method according to claim 1, wherein at least part of said dummy circuit is removed before said step of forming said thin metal film.

3. The method according to claim 1, wherein said electroplating is carried out under conditions that said electrically conductive substrate serving as a cathode is opposed to a planar anode with an interelectrode distance of 3 to 30 mm therebetween, and a plating solution of 45° to 70° C. is supplied between said anode and said cathode at a plating-solution contact speed of 6 to 12 m/sec and with a current density of 0.15 to 4.0 A/cm$^2$ applied.

4. The method according to claim 1, wherein said thin metal film comprises a thin copper film.

5. The method according to claim 4, wherein said thin copper film is formed by electroplating which is carried out under conditions that said electrically conductive substrate serving as a cathode is opposed to a planar anode with an interelectrode distance of 3 to 30 mm therebetween, and a plating solution of 45° to 70° C. is supplied between said anode and said cathode at a plating-solution contact speed of 6 to 12 m/sec and with a current density of 0.15 to 4.0 A/cm$^2$ applied.

6. A method of producing a conductor circuit board, comprising the steps of:
    forming a resist mask on a surface of a planar, electrically conductive substrate except portions thereof on which conductor circuits and dummy circuit are to be formed, said dummy circuit being formed between and close to conductor circuits which are isolated from each other;
    forming said conductor circuits and said dummy circuit on the surface of said electrically conductive substrate by electroplating;
    removing said resist mask from said electrically conductive substrate;
    forming a thin metal film over the surface of said electrically conductive substrate and surfaces of said conductor circuits;
    sandwiching an insulating substrate between two electrically conductive substrates formed by the above-mentioned steps and having first and second circuit patterns, respectively, the surface of each of said two electrically conductive substrates on which said conductor circuits and said thin metal film are formed facing said insulating substrate, and pressure-bonding said insulating substrate and said two electrically conductive substrates together to obtain a laminate;
    separating only said two electrically conductive substrates from said laminate, to obtain a circuit board;
    forming a through hole in said circuit board, and subjecting an inner surface of said through hole and both surfaces of said circuit board to through-hole plating; and
    removing portions of said thin metal film which electrically connect between said conductor circuits, by etching.

7. The method according to claim 6, wherein at least part of said dummy circuit is removed before said step of forming said thin metal film.

8. The method according to claim 6, wherein said electroplating is carried out under conditions that said electrically conductive substrate serving as a cathode is opposed to a planar anode with an interelectrode distance of 3 to 30 mm therebetween, and a plating solution of 45° to 70° C. is supplied between said anode and said cathode at a plating-solution contact speed of 6 to 12 m/sec and with a current density of 0.15 to 4.0 A/cm$^2$ applied.

9. The method according to claim 6, wherein said thin metal film comprises a thin copper film.

10. The method according to claim 9, wherein said thin copper film is formed by electroplating which is carried out under conditions that said electrically conductive substrate serving as a cathode is opposed to a planar anode with an interelectrode distance of 3 to 30 mm therebetween, and a plating solution of 45° to 70° C. is supplied between said anode and said cathode at a plating-solution contact speed of 6 to 12 m/sec and with a current density of 0.15 to 4.0 A/cm$^2$ applied.

* * * * *